United States Patent [19]

Chiang et al.

[11] Patent Number: 5,252,143

[45] Date of Patent: Oct. 12, 1993

[54] BIPOLAR TRANSISTOR STRUCTURE WITH REDUCED COLLECTOR-TO-SUBSTRATE CAPACITANCE

[75] Inventors: Shang-Yi Chiang, Walnut Creek; Theodore I. Kamins, Palo Alto, both of Calif.

[73] Assignee: Hewlett-Packard Company, Palo Alto, Calif.

[21] Appl. No.: 837,683

[22] Filed: Feb. 18, 1992

Related U.S. Application Data

[63] Continuation of Ser. No. 597,615, Oct. 15, 1990, abandoned.

[51] Int. Cl.⁵ .......................................... H01L 29/00
[52] U.S. Cl. .......................................... 148/33; 437/31; 437/89; 257/588; 148/DIG. 11; 148/DIG. 72
[58] Field of Search ................. 437/31, 32, 33, 34, 437/915; 148/33, 33.1, 3.2-33.6; 257/588, 773, 49

[56] References Cited

U.S. PATENT DOCUMENTS

| | | | |
|---|---|---|---|
| 4,381,202 | 4/1983 | Mori et al. | 437/34 |
| 4,425,574 | 1/1984 | Silvestri et al. | 357/50 |
| 4,539,744 | 9/1985 | Burton | 437/69 |
| 4,566,914 | 1/1986 | Hall | 437/31 |
| 4,651,410 | 3/1987 | Feygenson | 437/31 |
| 4,663,831 | 5/1987 | Birrittella et al. | 148/DIG. 11 |
| 4,696,097 | 9/1987 | McLaughlin et al. | 148/DIG. 50 |
| 4,764,480 | 8/1988 | Vora | 437/69 |
| 4,764,801 | 8/1988 | McLaughlin et al. | |
| 4,829,016 | 5/1989 | Neudeck | 437/31 |
| 4,849,371 | 7/1989 | Hansen et al. | 437/82 |
| 4,851,362 | 7/1981 | Suzuki | 437/162 |
| 4,860,077 | 8/1989 | Reuss et al. | 357/34 |
| 4,876,212 | 10/1989 | Koury | 148/33.3 |
| 4,879,255 | 11/1989 | Deguchi et al. | 437/31 |
| 4,902,641 | 2/1990 | Koury, Jr. | 148/DIG. 11 |
| 5,177,582 | 1/1993 | Meister et al. | 257/588 |

FOREIGN PATENT DOCUMENTS

| | | |
|---|---|---|
| 0267082 | 5/1988 | European Pat. Off. |
| 0306213 | 3/1989 | European Pat. Off. |
| 0375965 | 4/1990 | European Pat. Off. |
| 61-89668 | 5/1986 | Japan .................... 437/41 |

OTHER PUBLICATIONS

H. Ming Liaw, "Simox and Induced Lateral Overgrowth for Pedestal Bipolar", Technical Develp. (18), Oct. 1988.

A. S. Yue et al., "Multilayered Structure of GaAs/epo-Si/SiOs/Si", Jan. 1990, Jour. of Crystal Growth (99) pp. 356-360.

Primary Examiner—Brian E. Hearn
Assistant Examiner—Michael Trinh

[57] ABSTRACT

A pre-processed substrate structure for a semiconductor device. A subcollector layer is spaced apart from a substrate by a dielectric. A relatively small, lightly-doped epitaxial feed-through layer extends through the dielectric between the substrate and the subcollector. A transistor constructed over the subcollector has very low collector-to-substrate capacitance. A plurality of devices on a common substrate are electrically isolated from each other by channel stops formed in the substrate around each device.

19 Claims, 3 Drawing Sheets

BIPOLAR TRANSISTOR STRUCTURE WITH REDUCED COLLECTOR-TO-SUBSTRATE CAPACITANCE

CROSS REFERENCE TO RELATED APPLICATION(S)

This is a continuation of copending application Ser. No. 07/597,615 filed on Oct. 15, 1990, now abandoned.

BACKGROUND OF THE INVENTION

The present invention relates generally to transistors and more particularly to an improved substrate structure for bipolar and heterojunction bipolar transistors having reduced collector-to-substrate capacitance.

In a conventional bipolar or heterojunction bipolar transistor there is a p−substrate with a buried layer of n+silicon developed thereon. This buried layer is commonly called the subcollector layer. Then a lightly-doped layer of n type silicon is epitaxially grown over the buried layer with this lightly-doped layer being commonly called the collector layer.

To facilitate electrical connection to the collector region of the transistor, the subcollector region extends completely beneath the active region of the transistor and to at least one side thereof to permit electrical contact thereto. This results in a broad p-n junction between the substrate and the subcollector regions with the collector current flowing very close to the p type substrate region. The longer this p-n junction, the greater the substrate-to-collector capacitance of the semiconductor device.

It would be desirable to reduce the substrate-to-collector capacitance in bipolar and heterojunction bipolar transistors to facilitate operation at high frequencies without making it more difficult to establish electrical connection with the subcollector region.

SUMMARY OF THE INVENTION

The present invention provides a pre-processed substrate structure for constructing a semiconductor device having very low substrate-to-collector capacitance, thereby facilitating operation at high frequencies and convenient electrical connections with the elements of the device.

Briefly and in general terms, a substrate structure according to the invention includes a substrate of semiconductor material such as p−silicon, a subcollector layer of semiconductor material such as n+silicon, a dielectric between the subcollector and the substrate, a window through the dielectric, and a feed-through layer of epitaxial semiconductor material in the window. Of course, the substrate may instead be formed of n type silicon and the subcollector layer of p type silicon if desired.

The dielectric comprises, for example, silicon dioxide formed on the substrate. The subcollector layer is preferably a mixed deposition layer which comprises epitaxial silicon where it overlies the material in the window and polycrystalline silicon where it overlies the dielectric. Such a layer may be formed by any of several deposition processes known in the art.

The feed-through layer extends between, and is in contact with, the substrate and the subcollector. This layer typically is lightly doped to reduce the substrate-collector capacitance as much as possible. "Lightly doped" means that the material has been doped such that it is easily depleted of free carriers at a desired bias level.

In a first embodiment the feed-through layer does not extend out of the window. The size of the contact area between the feed-through layer and the subcollector is governed by the size of the window opening and is usually about equal to the size of the contact area between the feed-through layer and the substrate.

In a second embodiment the feed-through layer overfills the window and spills out onto a portion of the dielectric between the dielectric and the subcollector layer. The contact area between the feed-through layer and the subcollector is significantly larger than the contact area between the feed-through layer and the substrate.

In a third embodiment the dielectric is sunk into a portion of an upper surface region of the substrate. Another portion of the upper surface region, in which portion there is no dielectric but which is typically surrounded by dielectric, serves as the feed-through layer.

A complete semiconductor device, for example a transistor, is made by constructing a semiconductor structure such as collector, base and emitter layers on the subcollector of any of the above-described embodiments of the substrate structure. An active region of the semiconductor structure is aligned with the feed-through layer beneath the subcollector. To make a bipolar transistor the base layer is fabricated of silicon, whereas if a heterojunction bipolar transistor is desired the base is made out of silicon-germanium.

Channel stops generally surrounding the window are preferably used to define a region of the substrate where a semiconductor device is to be built and in particular to isolate the device from other devices to be fabricated elsewhere on the same substrate.

The smaller the area of contact between the substrate and the subcollector, the lower the substrate-to-collector capacitance will be. Thus it is usually desirable to make the window as small as possible. In the first and third embodiments the window is the same size as, or larger than, the active region of the semiconductor, and this size defines the size of the contact area between the substrate and the feed-through layer. In the second embodiment the size of the window, and hence the size of the contact area between the feed-through layer and the substrate, is smaller than that of the active region, resulting in even lower substrate-to-collector capacitance.

Other aspects and advantages of the present invention will become apparent from the following detailed description, taken in conjunction with the accompanying drawings, illustrating by way of example the principles of the invention.

DESCRIPTION OF THE PREFERRED EMBODIMENTS

Figure 1:
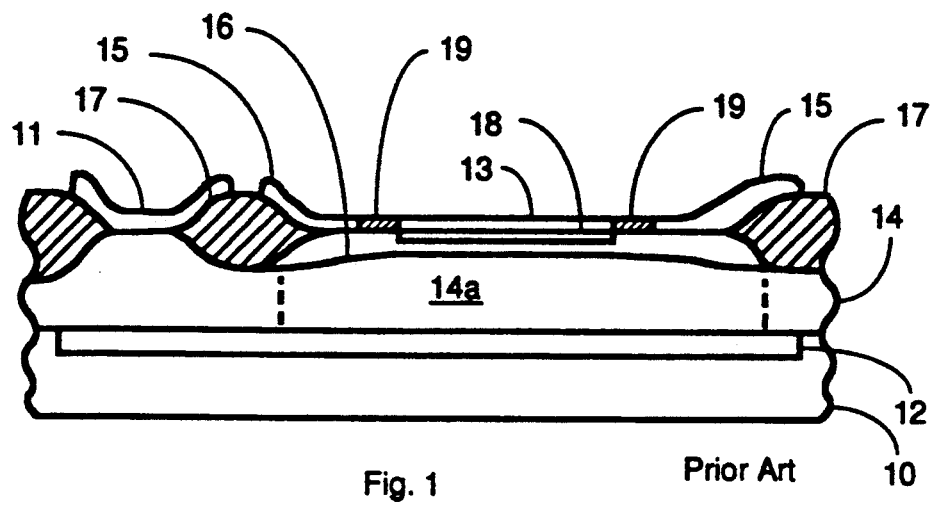
FIG. 1 is a cross-sectional schematic view of a conventional transistor according to the prior art.

As shown in the drawings for purposes of illustration, the invention is embodied in a novel substrate structure having a subcollector layer that is separated from a substrate by a dielectric except in a limited area defined by a window containing a feed-through layer.

There has been a need for a transistor having very low collector-to-substrate capacitance for use in high frequency circuits, but existing transistors have not adequately met this need. FIG. 1 illustrates a conventional silicon bipolar transistor of the prior art in cross-section. The transistor includes a $p^-$ substrate 10 with an $n^+$ buried, or subcollector, layer 12 on top. Above the subcollector layer 12 is an n type epitaxially grown collector layer 14 with an $n^+$ collector contact 11 and a $p^+$ base layer 16 on top of the collector layer 14 with silicon dioxide ($SiO_2$) 17 separating the contact 11 and the base layer 16 from each other. Over substantially the central portion of the base layer 16 there is an $n^+$ single crystal emitter 18 with an $n^+$ polycrystalline silicon emitter contact 13 on top of the layer 18. There is also a base contact 15 of $p^+$ silicon adjacent the collector and emitter contacts 11 and 13 are separated therefrom by $SiO_2$ 17 and 19, respectively.

The subcollector layer 12 extends beneath both an active region of the transistor (the active region is described generally as the emitter 13, the base 16 and a portion 14a of the collector 14 that lies beneath the base 16) and the remainder thereof, and the entire lower surface area of the subcollector 12 is in direct physical contact with the substrate 10. Much of the collector-to-substrate capacitance is attributable to this large area of contact between the subcollector and the substrate.

The present invention provides a pre-processed substrate structure for a semiconductor device. This structure has a dielectric between the subcollector and the substrate except in a relatively small area wherein a feed-through layer of epitaxial material extends between the subcollector and a portion of the substrate through a window in the dielectric. This structure reduces the contact area between the substrate and the subcollector, providing much lower substrate-to-collector capacitance than could otherwise be attained.

Figure 2:
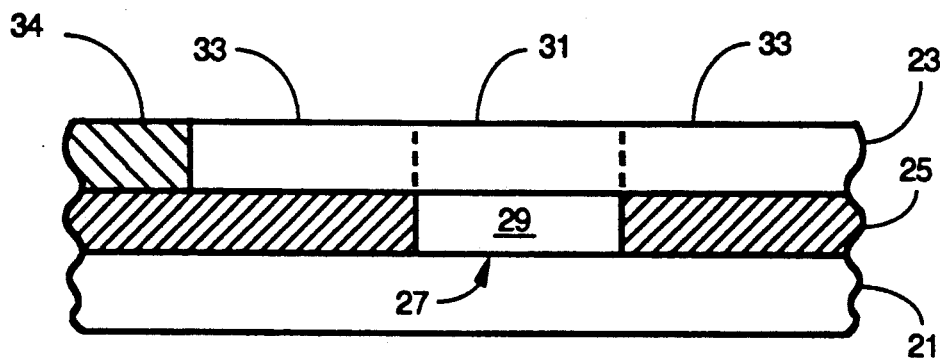
FIG. 2 is a cross-sectional schematic view of a substrate structure according to a first embodiment of the present invention.
Figure 3:
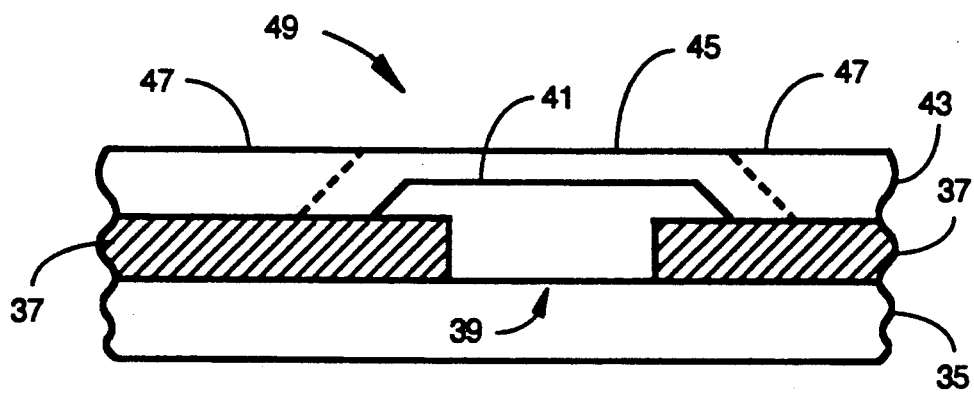
FIG. 3 is a cross-sectional schematic view of a substrate structure according to a second embodiment of the invention.
Figure 4:
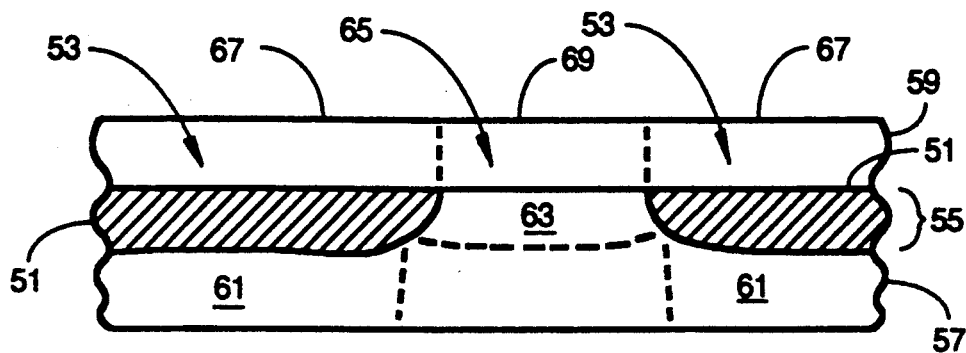
FIG. 4 is a cross-sectional schematic view of a substrate structure according to a third embodiment of the invention.

Three illustrative embodiments of the present invention are shown in FIGS. 2, 3 and 4, respectively. Each of these embodiments provides a slightly different way to pre-process the substrate to develop a subcollector layer that is substantially separated, over much of its area, from the substrate material by a dielectric such as $SiO_2$.

In the first embodiment, the pre-processed substrate structure includes a substrate 21 of semiconductor material such a $p^-$ silicon, a subcollector layer 23 of semiconductor material such as $n^+$ silicon, a dielectric 25 between the subcollector 23 and the substrate 21 with a window 27 therethrough, and a feed-through layer 29 of epitaxial semiconductor material in the window 27, as shown in FIG. 2. In this embodiment the dielectric 25 serves as an intervening layer that spaces the subcollector layer 23 apart from the substrate 21. The subcollector layer 23 preferably comprises mixed-deposition material having an epitaxial portion 31 that overlies the feed-through layer 29 in the window 27 and a ploycrystalline portion 33 that overlies the dielectric 25.

The substrate structure is preferably fabricated with a substrate of $p^-$ silicon and a subcollector of $n^+$ silicon if the semiconductor device to be constructed on the structure is an npn transistor. These polarities are reversed if a pnp transistor is to be constructed.

The window 27 is typically about the size of an active region of the semiconductor device that is to be constructed on the subcollector layer 23. The feed-through layer 29, which preferably comprises either $n^-$ or $p^-$ silicon as desired, fills or partially fills the window 27. The layer 29 is preferably selectively epitaxially grown in the window 27.

The subcollector layer 23 preferably comprises heavily doped silicon. The epitaxial portion 31 and the polycrystalline portion 33 are formed either by directly depositing heavily doped silicon or by depositing undoped or lightly doped silicon and then doping the silicon as desired.

Alternatively, the layer 29 is developed as a lower portion of the subcollector layer 23, for example by growing the subcollector layer 23 as a mixed-deposition layer in, over and around the window. The part of the material which is in and over the window is epitaxial and the part which surrounds the window is polycrystalline. After the material is grown, it is doped such that the relatively greater diffusion rate through polycrystalline silicon than through epitaxial silicon provides the desired doping levels in the subcollector and in the feed-through material in the window.

An insulating layer 34 abuts the subcollector layer 23 to electrically isolate the subcollector layer 23 from any nearby device.

According to the second embodiment, the area of contact between the feed-through layer and the substrate is made smaller than the area of the active region of the semiconductor device to further reduce the substrate-to-collector capacitance. As shown in FIG. 3, this embodiment is constructed by starting as with the first embodiment with a substrate 35 and a dielectric 37 such as $SiO_2$, with a window 39 therethrough, grown on the substrate 35. A feed-through layer 41 overfills the window 39, a portion of the layer 41 extending laterally outward from the window 39 over the dielectric 37, between the dielectric and an overlying subcollector layer 43. The subcollector 43 includes an epitaxial portion 45 that overlies the feed-through layer 41 and a polycrystalline portion 47 that overlies the dielectric 37 to provide an upper surface 49 on which to construct the semiconductor device. Preferably the upper surface 49 is planar, but depending on the desired structure of the device to be built thereon a non-planar surface may be adequate.

In the third embodiment a dielectric 51 is formed in, or sunk into, a first portion 53 of an upper surface region 55 of a substrate 57 as shown in FIG. 4. The dielectric 51 separates a subcollector layer 59 from underlying portions 61 of the substrate 57. The dielectric 51, which as in the other embodiments is preferably $SiO_2$, is sunk into the substrate 57 by the LOCOS process or the like. The feed-through layer 63 of this embodiment comprises a second portion 65 of the upper surface region 55 of the substrate 57, in which portion no dielectric is formed.

As with the other embodiments, the subcollector 59 comprises a mixed layer of polycrystalline silicon 67 and epitaxial silicon 69. The polycrystalline silicon 67 overlies the dielectric 51. The epitaxial silicon 69 overlies the feed-through layer 63.

In the first and third embodiments as shown in FIGS. 2 and 4, respectively, the active region of the semiconductor device to be built on the subcollector layer will be above and generally aligned with and in most cases about the same size as the area of the feed-through layers 29 and 63, respectively. However, the lateral dimensions of the active region may be some 10% to 15% smaller than the dimensions of the feed-through layer to avoid sidewall effects which are commonly found in a mixed epitaxial and polycrystalline deposition such as the subcollector layer of the present invention.

In the second embodiment the lateral dimensions of the active region are 25% to 30% or more larger than the lateral dimensions of the dimensions of the portion of the feed-through layer 41 which occupies the window 39 and contacts the substrate 35.

These dimensional percentages are only presented as being illustrative and are not intended to be limiting in any way since they are largely dependent on production tolerances. As production techniques improve, there will be improved production tolerances which will further increase the advantages offered by the present invention.

Figure 5:
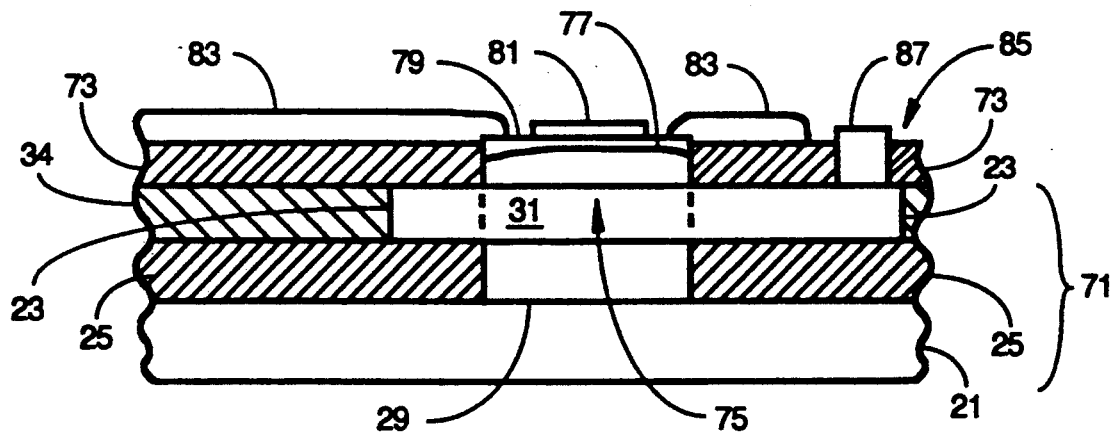
FIG. 5 is a cross-sectional schematic view of a bipolar transistor built on a substrate structure of the kind illustrated in FIG. 2.

FIG. 5 illustrates an example of a silicon bipolar transistor built on a pre-processed substrate structure generally 71 according to the first embodiment as shown in FIG. 2. Elements of the structure 71 which are similar to corresponding elements in FIG. 2 have been given the same reference numerals.

A $SiO_2$ dielectric layer 73 is formed on the surface of the subcollector 23 with a window 75 above the feed-through layer 29. N type silicon is then deposited in the window 75 to form a collector layer 77, which layer does not completely fill the window. P type silicon is then developed over the collector layer 77, filling the remaining portion of the window, to form a base layer 79. An $n^+$ emitter layer 81, typically having a smaller area than the base 79, is then formed centrally over the base 79. A polycrystalline silicon layer 83 is formed over the $SiO_2$ layer 73 and an outer circumference of the base layer 79 to provide an external connection to the base 79. A second window 85 is opened through the $SiO_2$ layer 73 and this second window is overfilled with n or $n^+$ silicon to make a contact 87 with the subcollector layer 23. Insulating material 34 isolates the transistor from other nearby devices (not shown).

The active region of the finished transistor may be considered generally as that portion which occupies the window 75. The active region is generally aligned with, and typically has similar lateral dimensions as, that portion of the surface area of the substrate 21 which is in contact with the feed-through layer 29. As discussed above, in some embodiments the lateral dimensions of the active region are either larger or smaller than those of the feed-through layer.

Although a bipolar transistor constructed on a substrate structure according to the first embodiment has been described, it will be apparent that such a transistor may be fabricated on a structure according to any of the embodiments, as desired. It will also be apparent that other kinds of bipolar transistors may be constructed on a substrate structure according to the invention.

Figure 6:
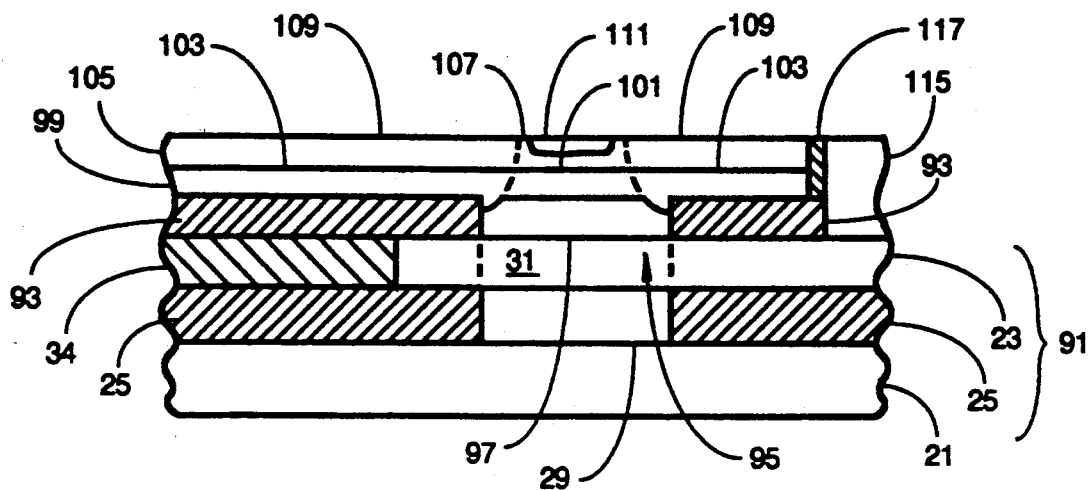
FIG. 6 is a cross-sectional schematic view of a heterojunction bipolar transistor built on a substrate structure of the kind illustrated in FIG. 2.

FIG. 6 illustrates an example of a silicon-germanium heterojunction bipolar transistor built on a pre-processed substrate structure generally 91 according to the first embodiment as shown in FIG. 2. As with the example of FIG. 5, elements of the structure 71 which are similar to corresponding elements in FIG. 2 have been given the same reference numerals.

A $SiO_2$ dielectric layer 93 is formed on the subcollector 23 with a window 95 above the feed-through layer 29. N or $n/n^+$ silicon is then deposited in the window 95 to form a collector layer 97. $P^+$ silicon-germanium is then deposited over the dielectric 93 and the collector 97, forming a base layer 99. The base layer 99 comprises an epitaxial portion 101 over the collector layer 97 and a polycrystalline portion 103 elsewhere. A silicon emitter layer 105 is deposited over the base layer 99; the layer 105 includes an epitaxial portion 107 over the epitaxial portion 101 of the base 99 and a polycrystalline portion 109 over the polycrystalline portion 103 of the base 99. A p type dopant is added to the polycrystalline portions 103 and 109. Then an $n^+$ silicon emitter contact layer 111 is added over the epitaxial portion 107 of the emitter 105. A second window 113 is opened through the $SiO_2$ layer 93 and is filled with n or $n^+$ silicon to make a contact 115 with the subcollector layer 23 to provide for an external collector connection. Insulating material 34 and 117 is used as needed to prevent unwanted electrical conduction paths.

While each of the discussion in this specification only address a single device on each substrate, each of the features of the present invention also lends itself to applications where there is more than one active device on the pre-processed substrate of the present invention.

Figure 7:
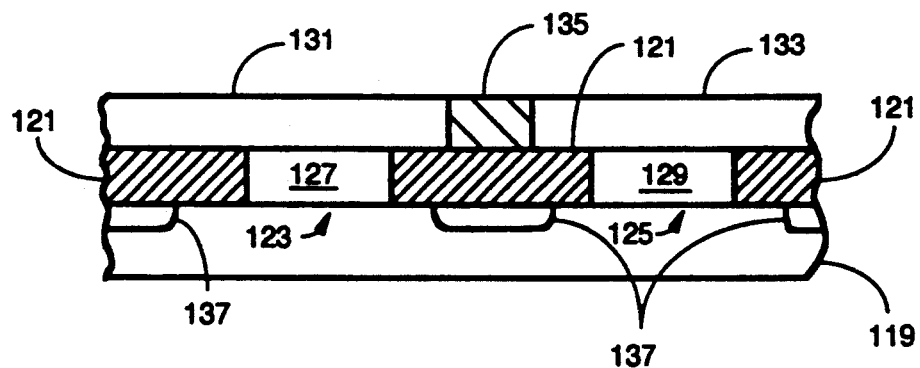
FIG. 7 is a cross-sectional schematic view of an embodiment of the invention wherein a plurality of active device regions are separated by channels stops.

A pre-processed substrate structure configured to receive a plurality of semiconductor devices is illustrated in FIG. 7. The structure includes a substrate 119, made for example of $p^-$ silicon; a dielectric layer 121, for example of $SiO_2$, on the substrate with windows 123 and 125 therethrough; lightly doped silicon, for example $n^-$ silicon, in the windows to form feed-through layers 127 and 129, respectively; mixed-deposition $n^+$ silicon subcollectors 131 and 133 over the feed-through layers 127 and 129, respectively; and insulating material 135 to electrically isolate the subcollectors from each other. Separate semiconductor devices (not shown) are developed over each of the subcollectors as has already been described.

To prevent any low resistance path through the substrate 119 between the semiconductor devices (such a path may be caused, for example, by the oxidation process used to make the dielectric or by a stray electric field that might cause the top of the substrate to behave as if it were n type silicon), $p^+$ channel stop regions 137 are preferably diffused into the surface of the substrate 119 to electrically isolate the devices and to insure that there are no low resistance paths through the substrate 119 from one device to another. These channel stops are primarily necessary when a p type substrate is used; this is because p type silicon is susceptible to inversion during oxidation whereas n type this is because p type silicon is susceptible to inversion during oxidation whereas n type silicon tends to become more heavily n · type when oxidized.

In each of the embodiments which have been discussed above, the actual thickness of the various layers have not been discussed. While layer thicknesses are important and sometimes critical to the operation of the finished device, those thicknesses are selectable depending on the performance environment in which the device is to be used and their selection can be made by one skilled in the art.

Although certain layers have been called the collector and the emitter layers herein, the nearly symmetrical behavior of many transistor structures allows those layers to be used in the alternative mode, e.g. interchanging the emitter and collector functions. Also, the polarities given above are for npn devices except as otherwise noted, but the various embodiments and examples are readily adapted for pnp devices by reversing the polarities of the various layers. Of course, as already discussed the channel regions 137 are primarily useful in connection with p type substrates.

From the foregoing it will be appreciated that the pre-processed substrate structure of the invention provides a means of constructing a transistor having very low substrate-to-collector capacitance. The structure provided by the invention is readily adaptable for either npn or pnp devices and is advantageously used to fabricate a plurality of transistors on a single substrate. Electrical connections with the collector are easily established.

Although a specific embodiment of the invention has been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. A pre-processed substrate structure for a semiconductor device, the structure comprising:
   a substrate of semiconductor material;
   a dielectric for electrically insulating the substrate, the dielectric having a window therethrough;
   a feed-through layer of epitaxial semiconductor material in and overfilling the window and extending laterally over a portion of the dielectric; and
   a substantially planar continuous subcollector layer of semiconductor material that is physically separated from the substrate by the dielectric, the subcollector layer including an epitaxial portion distinct from the feedthrough layer that overlies the feed-through layer and a polycrystalline portion that overlies the dielectric.

2. A structure according to claim 1 wherein the dielectric is formed on the substrate as an intervening layer that spaces the subcollector layer apart from the substrate.

3. A semiconductor device comprising a pre-processed substrate structure according to claim 1 and a semiconductor structure including an active region in substantial alignment with the feed-through layer that lies beneath the subcollector layer.

4. A device according to claim 3 wherein the semiconductor structure comprises a collector layer over the subcollector layer, a base layer over the collector layer, an emitter layer over the base layer, and contact means for establishing electrical connections with the collector, base and emitter layers.

5. A device according to claim 4 wherein the base layer comprises silicon-germanium.

6. A pre-processed substrate structure for a semiconductor device, the structure comprising:
   a substrate of semiconductor material;
   a dielectric for electrically insulating the substrate, the dielectric having a window therethrough;
   a feed-through layer of epitaxial semiconductor material confined within the window, a lower surface of the feed-through layer in contact with that portion of the substrate which underlies the window; and
   a substantially planar continuous subcollector layer of semiconductor material that is physically separated from the substrate by the dielectric, the dielectric comprising an intervening layer between the substrate and the subcollector layer, the subcollector layer including an epitaxial portion distinct from the feed-through layer that overlies the feed-through layer in the window and a polycrystalline portion that overlies the dielectric, an upper surface of the feed-through layer in contact with that portion of the subcollector layer which overlies the window, the epitaxial portion in substantial vertical alignment with the underlying feed-through layer and the polycrystalline portion in substantial vertical alignment with the underlying dielectric.

7. A semiconductor device comprising a pre-processed substrate structure according to claim 6 and a semiconductor structure on the subcollector layer of the substrate structure, the semiconductor structure including an active region in substantial alignment with the feed-through layer that lies beneath the subcollector layer.

8. A device according to claim 7 wherein the semiconductor structure comprises a collector layer over the subcollector layer, a base layer over the collector layer, an emitter layer over the base layer, and contact means for establishing electrical connections with the collector, base and emitter layers.

9. A device according to claim 8 wherein the base layer comprises silicon-germanium.

10. A structure according to claim 6 and further comprising a second feed-through layer of epitaxial semiconductor material confined within a second window in the dielectric, a lower surface of the second feed-through layer in contact with that portion of the substrate which underlies the second window, an upper surface of the second feed-through layer in contact with that portion of the subcollector layer which overlies the second window, that portion of the subcollector layer which overlies the second feed-through layer comprising epitaxial material.

11. A structure according to claim 10 and further comprising a channel stop region in the surface of the substrate between the first and second regions thereof, operative to electrically isolate the first and second regions from each other.

12. A structure according to claim 11 wherein the substrate comprises p type silicon and the channel stop region comprises p+ type silicon.

13. A pre-processed substrate structure for a semiconductor device, the structure comprising:
    a substrate of semiconductor material;
    a dielectric for electrically insulating the substrate, the dielectric having a window therethrough;
    a feed-through layer of epitaxial semiconductor material overfilling the window and extending laterally outward therefrom over a portion of the dielectric layer, a lower surface of the feed-through layer in contact with that portion of the substrate which underlies the window; and a substantially planar continuous subcollector layer of semiconductor material that is physically separated from the substrate by the dielectric, the dielectric comprising an intervening layer between the substrate and the subcollector layer, the subcollector layer including an epitaxial portion distinct from the feed-through layer that overlies the feed-through layer in the window and the lateral extension of the feed-through layer and a polycrystalline portion that overlies the dielectric, an upper surface of the feed-through layer in contact with that portion of the subcollector layer which overlies the window and the lateral extension of the feed-through layer, said upper surface having a larger area than said lower surface, the epitaxial portion of the subcollector layer in substantial vertical alignment with the underlying feed-through layer and the polycrystalline portion in substantial vertical alignment with the underlying dielectric.

14. A semiconductor device comprising a pre-processed substrate structure according to claim 13 and a semiconductor structure on the subcollector layer of the substrate structure, the semiconductor structure including an active region in substantial alignment with the feed-through layer that lies beneath the subcollector layer.

15. A device according to claim 14 wherein the semiconductor structure comprises a collector layer over the subcollector layer, a base layer over the collector layer, an emitter layer over the base layer, and contact means for establishing electrical connections with the collector, base and emitter layers.

16. A device according to claim 15 wherein the base layer comprises silicon-germanium.

17. A structure according to claim 13 and further comprising a second-feedthrough layer of epitaxial semiconductor material in and overfilling a second window in the dielectric and extending laterally outward therefrom between the dielectric layer and the subcollector layer, a lower surface of the second feed-through layer in contact with that portion of the substrate which underlies the second window, an upper surface of the second feed-through layer in contact with that portion of the subcollector layer which overlies the second window and the lateral extension of the second feed-through layer, said upper surface having a larger area than said lower surface, that portion of the subcollector layer which overlies the second feed-through layer comprising epitaxial material.

18. A structure according to claim 17 and further comprising a channel stop region in the surface of the substrate between the first and second regions thereof, operative to electrically isolate the first and second regions from each other.

19. A structure according to claim 18 wherein the substrate comprises p type silicon and the channel stop region comprises $p^+$ type silicon.

* * * * *